(12) United States Patent
Balboni et al.

(10) Patent No.: US 12,146,903 B2
(45) Date of Patent: Nov. 19, 2024

(54) DC METER FOR ELECTRICAL VEHICLE CHARGING STATION

(71) Applicant: LEM INTERNATIONAL SA, Meyrin (CH)

(72) Inventors: Florent Balboni, Lyons (FR); Tomislav Hajak, Saint Priest (FR); Sylvain Barrat, Belleville em Beaujolais (FR)

(73) Assignee: LEM INTERNATIONAL SA, Meyrin (CH)

( * ) Notice: Subject to any disclaimer, the term of this patent is extended or adjusted under 35 U.S.C. 154(b) by 152 days.

(21) Appl. No.: 17/617,807

(22) PCT Filed: Jun. 5, 2020

(86) PCT No.: PCT/EP2020/065735
§ 371 (c)(1),
(2) Date: Dec. 9, 2021

(87) PCT Pub. No.: WO2020/249490
PCT Pub. Date: Dec. 17, 2020

(65) Prior Publication Data
US 2022/0334156 A1    Oct. 20, 2022

(30) Foreign Application Priority Data

Jun. 12, 2019 (EP) .................................. 19179831

(51) Int. Cl.
*G01R 22/06* (2006.01)
*B60L 53/62* (2019.01)
*G01R 19/10* (2006.01)

(52) U.S. Cl.
CPC .............. *G01R 22/06* (2013.01); *B60L 53/62* (2019.02); *G01R 19/10* (2013.01)

(58) Field of Classification Search
CPC .......... B60L 53/10–11; B60L 53/14–18; B60L 53/30; B60L 53/60–62; Y02T 90/12;
(Continued)

(56) References Cited

U.S. PATENT DOCUMENTS 9,372,207 B1    6/2016  Brouwer
10,084,266 B1 *  9/2018  Tsao ........................ B60L 53/18
(Continued)

FOREIGN PATENT DOCUMENTS

CN    206537161    10/2017
CN    107765149    3/2018
(Continued)

OTHER PUBLICATIONS

I. Stoychev, J.-C. Tebbe and J. Oehm, "A measurement system for electric car charging stations utilising a FPGA board for flexibility in configuration," 2016 IEEE International Symposium on Circuits and Systems (ISCAS), Montreal, QC, Canada, 2016, pp. 630-633 (Year: 2016).*

(Continued)

*Primary Examiner* — Daniel R Miller
(74) *Attorney, Agent, or Firm* — Faegre Drinker Biddle & Reath LLP

(57) ABSTRACT

A DC meter for an electrical vehicle charging station having a pair of DC power supply lines extending from a charging station controller to an electrical vehicle connector, the DC meter comprising a meter unit and a sensor unit. The meter unit comprises a user interface, a sensor interface for connection to the sensor unit, a metering interface for connection to the charging station controller, and a microprocessor configured to receive and process signals received from the sensor unit, to exchange data with the charging station controller and to receive commands from the user interface and output information to the user interface. The sensor unit (Continued)

is separate and connected at a point distal from the meter unit via an interconnection cable for the transmission of measurement signals.

9 Claims, 6 Drawing Sheets

(58) Field of Classification Search
CPC ..... Y02T 90/14; Y02T 10/7072; G01R 22/06; G01R 19/10; G01R 19/2513; G01R 1/203; G01R 19/16528; G01R 21/06
See application file for complete search history.

(56) References Cited

U.S. PATENT DOCUMENTS

| | | | |
|---|---|---|---|
| 2010/0207588 A1 | 8/2010 | Lowenthal | |
| 2011/0213983 A1 | 9/2011 | Staugaitis | |
| 2012/0265459 A1 | 10/2012 | Sfaelos | |
| 2015/0346288 A1* | 12/2015 | Hardy | G01R 21/00 702/58 |
| 2016/0144728 A1* | 5/2016 | Harper | B60L 53/67 320/109 |
| 2019/0375309 A1* | 12/2019 | Fuhrer | B60L 53/62 |
| 2020/0185847 A1* | 6/2020 | Feldner | H01R 13/6683 |
| 2021/0362614 A1* | 11/2021 | Carr | B60L 53/51 |

FOREIGN PATENT DOCUMENTS

| | | |
|---|---|---|
| CN | 208881611 | 5/2019 |
| EP | 3093184 | 11/2016 |
| JP | 2018142544 | 9/2018 |
| JP | 2018538786 | 12/2018 |
| JP | 20191015538 | 1/2019 |
| JP | 2019513061 | 5/2019 |

OTHER PUBLICATIONS

International Search Report and Written Opinion issued by the International Searching Authority, dated Aug. 18, 2020, for International Patent Application No. PCT/EP2020/065735; 15 pages.

* cited by examiner

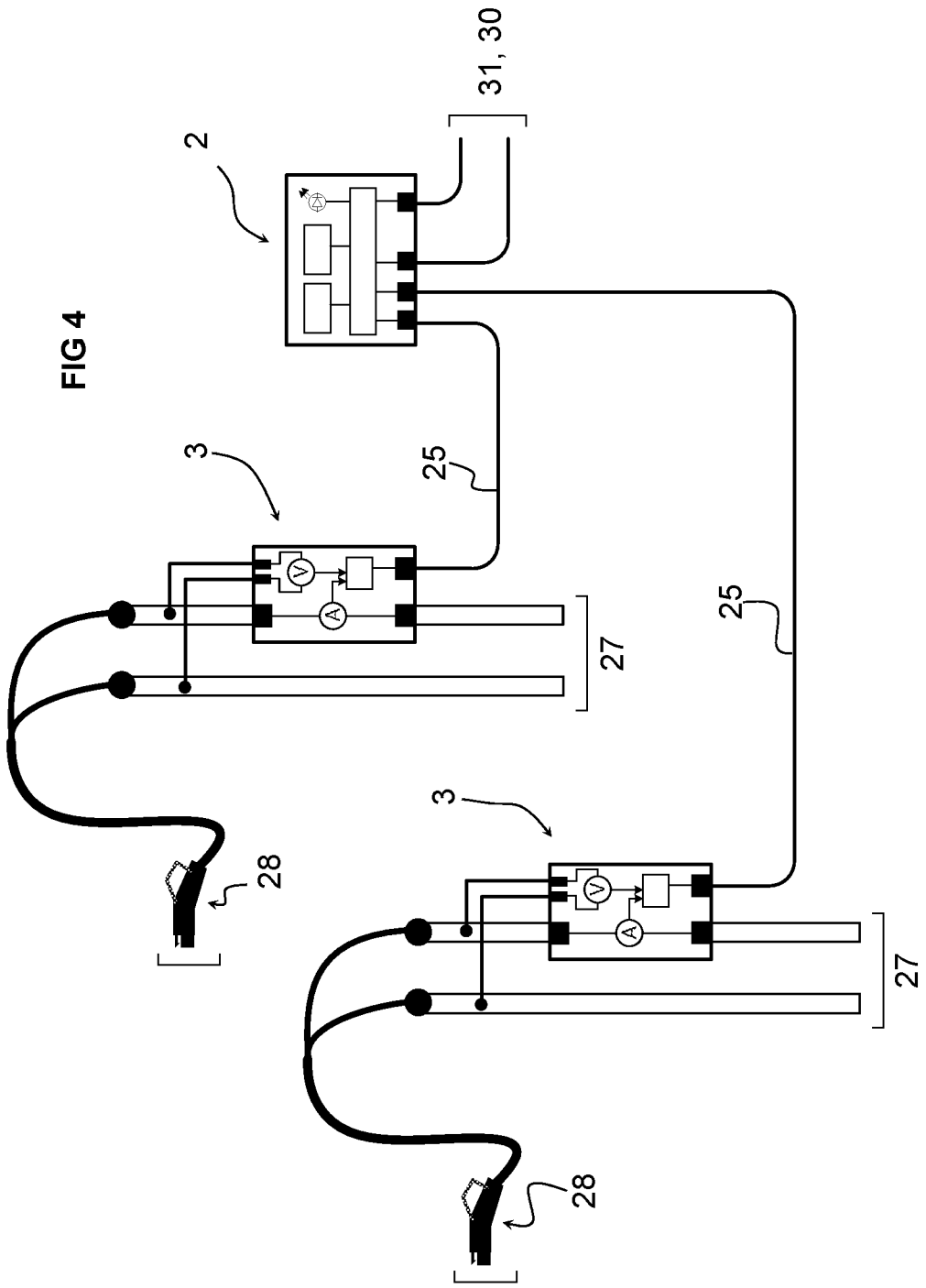

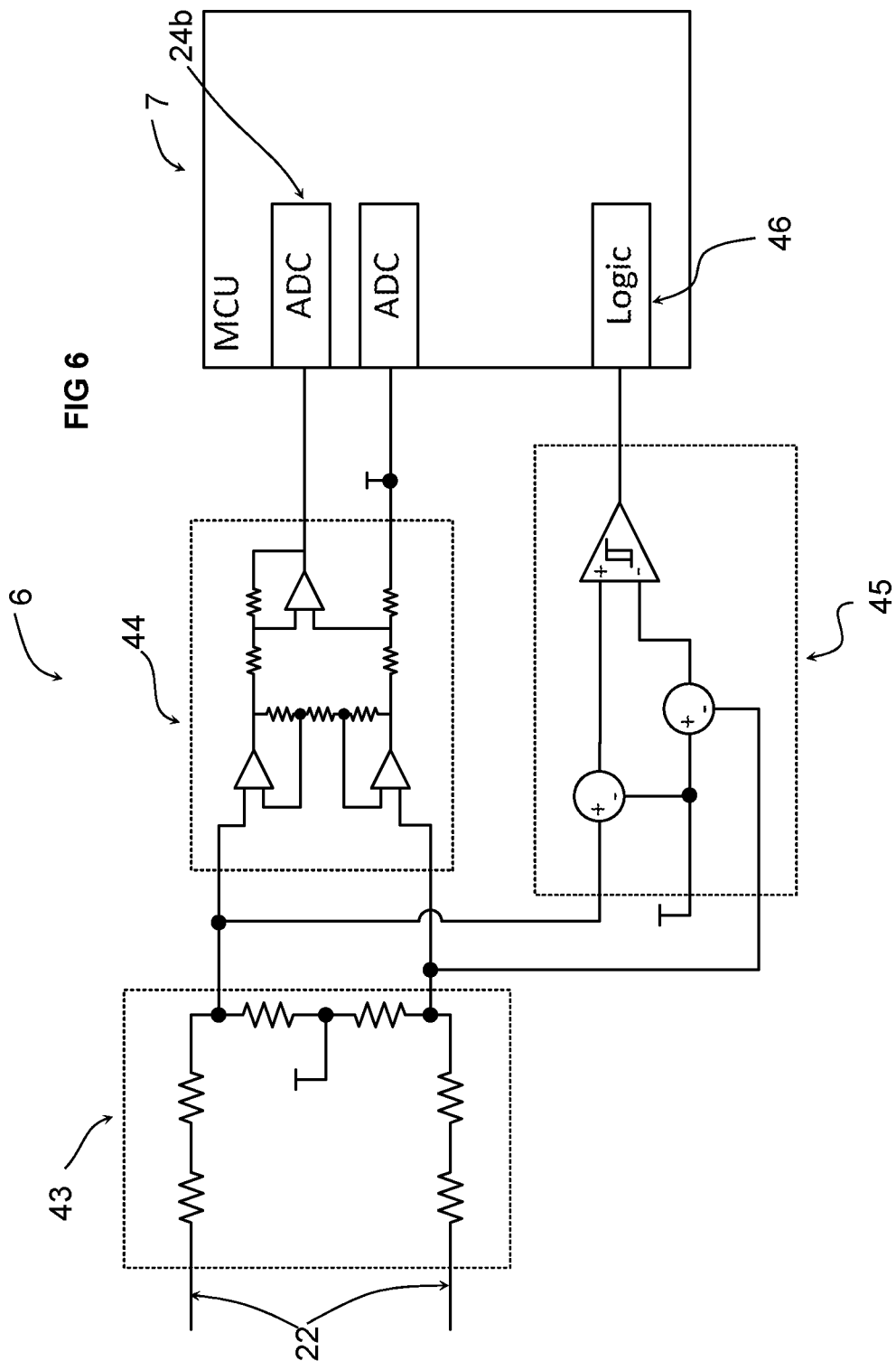

DC METER FOR ELECTRICAL VEHICLE CHARGING STATION

CROSS-REFERENCE TO RELATED APPLICATIONS

The present application is a national stage entry of International (PCT) Patent Application Number PCT/EP2020/065735, filed Jun. 5, 2020, which claims priority to European Patent Application Number 19179831.3, filed Jun. 12, 2019, the subject matter of which are expressly incorporated herein by reference.

The present invention relates to a direct current (DC) meter for electrical vehicle charging stations.

Currently implemented charging stations for electrical vehicles typically allow charging at a flat rate per charge or according to the time of connection. Considering however the increase in use of electrical vehicles, there is a need to measure the actual power consumption during a charge so that the amount of energy consumed may be billed to the user.

In view of the need to bill users for the amount of energy consumed, the measurements of the consumed energy must be accurate, reliable and protected against manipulation.

In view of the foregoing, it is an object of this invention to provide a DC meter for electrical vehicle charging stations that is accurate, reliable, and easy to implement.

It is an object of the invention to provide a DC meter that is easy to install and that is economical to manufacture and to operate, in electrical vehicle charging station, in which mechanical, thermal and system integration represent major constraints.

Objects of the invention have been achieved by providing a DC meter according to claim 1.

Disclosed herein is a DC meter for an electrical vehicle charging station having a pair of DC power supply lines extending from a charging station controller to an electrical vehicle connector. The DC meter comprises a meter unit and a sensor unit. The meter unit comprises a user interface, a sensor interface for connection to the sensor unit, a metering interface for connection to the charging station controller, and a microprocessor configured to receive and process signals received from the sensor unit, to exchange data with the charging station controller and to receive commands from the user interface and output information to the user interface.

The sensor unit is separate and connected at a point distal from the meter unit via an interconnection cable for the transmission of measurement signals, the sensor unit being coupled to one of the pair of DC power supply lines configured for measuring the current flowing through said power line, the sensor unit further comprising a voltage sensor for coupling to each of the pair of power supply lines for measuring a voltage difference therebetween. The sensor unit further comprises a microprocessor with analog to digital convertors (ADC) for converting the received analog voltage measurement and current measurement signals to digital signals, the sensor unit further comprising a communication interface configured for transmission of encrypted data through the interconnection cable to the meter unit.

In an embodiment, the microprocessor of the sensor unit comprises a module for computation of the power consumed by the electrical vehicle using the voltage measurement and current measurement signals, the power measurement value being transmitted to the meter unit.

In an embodiment, the power measurement computation is computed from a current measurement signal and/or voltage measurement signal sampled every 1 to 0.01 seconds preferably sampled between 0.5 and 0.05 seconds.

In an embodiment, the voltage sensor comprises a connector coupled to voltage cables having connection ends distal from the sensor unit for connection to the DC power supply lines at or proximate the electrical vehicle connector.

In an embodiment, the sensor unit and meter unit comprise unique identification numbers stored in respective memories, the sensor unit and meter unit being able to communicate once they have been paired with their unique identification numbers.

In an embodiment, the sensor unit and meter unit comprise encryption modules for encrypted communication of data between the sensor unit and meter unit.

In an embodiment, the current sensor is a current measurement shunt and one of the DC power supply lines is split and comprises connection ends for connection to respective connection terminals of the sensor unit.

In an embodiment, the sensor unit comprises a housing having at least a base and a cap, primary conductor connection terminals being provided extending out of the base and covered by the cap, the sensor unit further comprising a connector for the voltage sensor cables and a connector for the communication interface for connection to the interconnection cable, the cover being removably positionable over the terminals and connectors and comprising means for tamper proof securing to the base.

In an embodiment, in addition to a power measurement signal transferred from the sensor unit to the meter unit, voltage and current measurement data are also transmitted.

In an embodiment, the sensor unit communication interface transmits data to the meter unit via the interconnection cable at a voltage of less than 50 volts, preferably at or less than 24 volts, for instance 5 or 12 volts.

Further objects and advantageous features of the invention will be apparent from the claims, from the detailed description, and annexed drawings, in which:

Figure 3B:
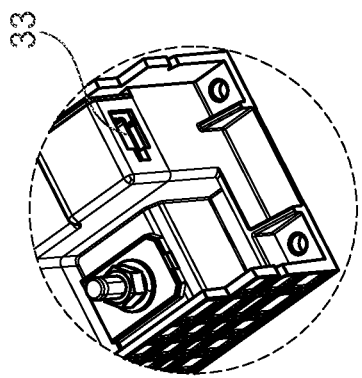
Figure 3D:
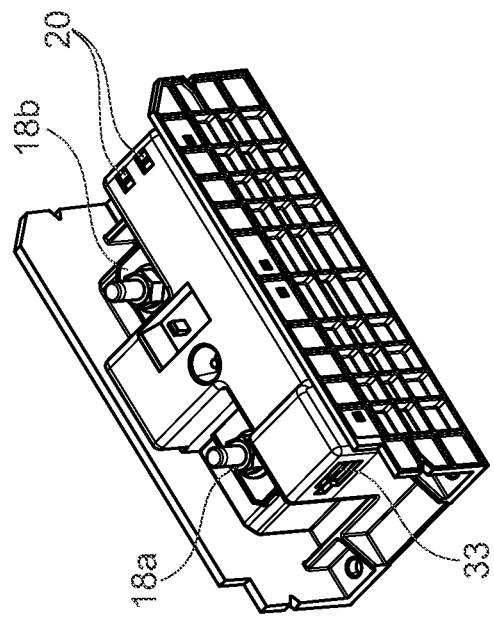
Figure 3A:
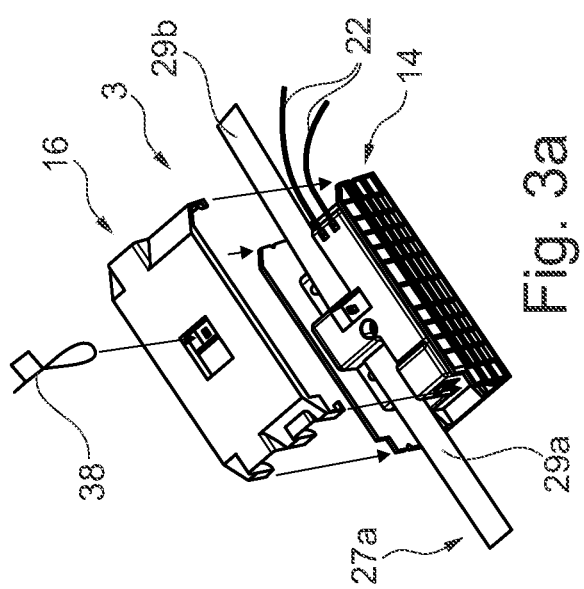

FIG. 3*a* is a perspective view of the sensor unit of a DC meter, with cover in an open position, according to embodiment of the invention;

FIG. 3*b* is a perspective view of the sensor unit of FIG. 3*a* with cover and cables removed.

Figure 3C:
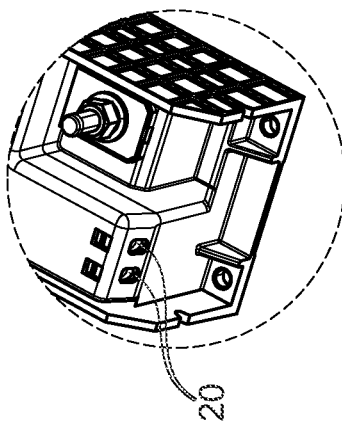

FIG. 3*c* is a detailed view of a portion of the sensor unit of FIG. 3*a;*

FIG. 3*d* is a detailed view of a portion of the sensor unit of FIG. 3*a;*

Figure 5A:
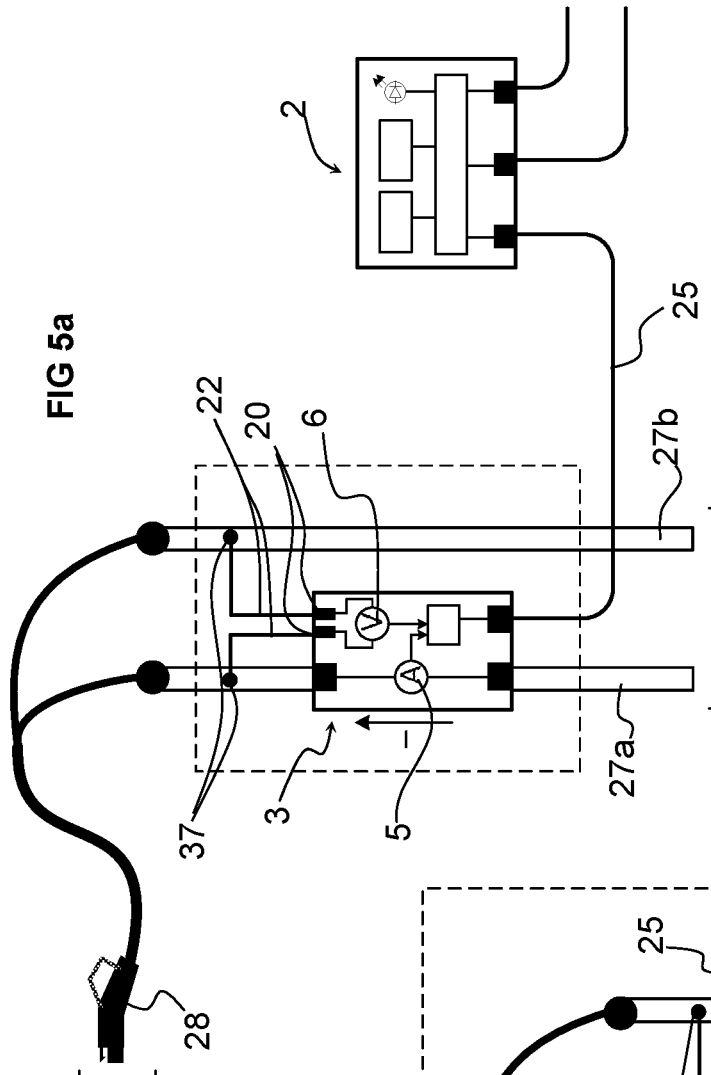
Figure 5B:
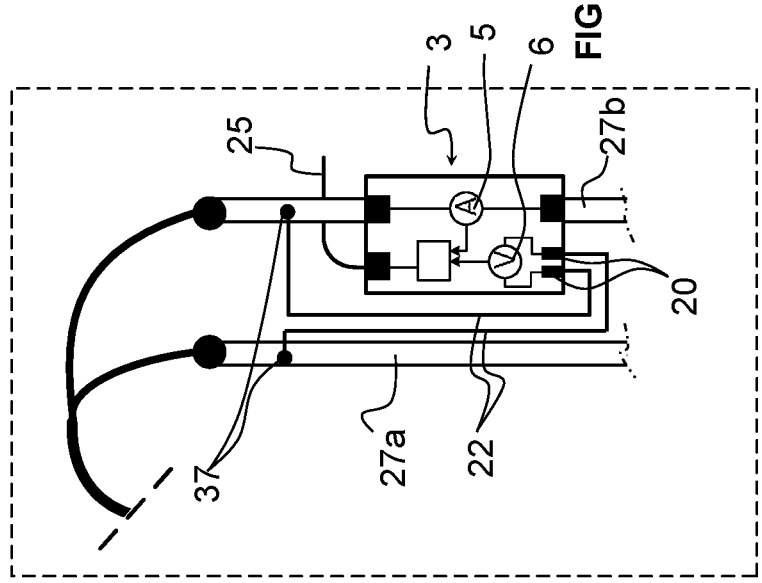

FIG. 4 is a schematic view of a plurality of sensor units connected to a single common meter unit of a DC meter according to an embodiment of the invention;

FIGS. 5*a* and 5*b* illustrate sensor units of a DC meter according to an embodiment of the invention, mounted on different lines of the pair of power lines;

FIG. 6 is a schematic circuit diagram of a voltage sensor of a sensor unit of a DC meter according to an embodiment of the invention.

Referring to the figures, a DC meter 1 according to an embodiment of the invention is connected to an electrical vehicle charging station controller 40, the charging station controller connected via a power converter 41 to a DC power link connected at the other end to an electrical vehicle (EV) connector 28 that is standardized and configured for coupling to an electrical vehicle.

The DC meter 1 comprises a meter unit 2 and a sensor unit 3 interconnected by an interconnection cable 25. The meter unit 2 is connected on the one hand to the sensor unit 3 via said interconnection cable 25 and on the other hand to a controller 41 of the charging station controller that supplies the DC electrical current to the electrical vehicle. The interconnection to the charging station controller comprises a data connection that is preferably a cabled connection such as a cable using the Ethernet protocol. In a variant, the data connection may also be a wireless data communication connection, for instance using Wi-Fi and/or a mobile phone cellular communications network.

The interconnection cable 25 may include an electrical and/or optical cable for data communication between the sensor unit 3 and the meter unit 2 and may optionally further comprises a power cable for supplying power from the meter unit to the sensor unit. The data and power supply cable may use a standard protocol for instance according to a CAN bus network. Other data communications standards may be employed.

The meter unit 2 comprises a user interface 9 that may include a screen, for instance liquid crystal display screen, buttons in order to enter user commands, and status lights to indicate errors or other operational states. The meter unit further comprises a microprocessor 10 for managing the incoming sensor signals and outgoing signals to the metering interface with the charging station controller as well as various input and output functions. The meter unit includes a tamper sensor in the housing of the DC meter that detects the integrity of the DC meter and that can signal and record any breaking into or opening of the DC unit housing, or severing of a cable. Events such as authorized access for maintenance or other purposes in the DC meter unit may also be recorded by the tamper sensor connected to a memory 36 of the processor.

The use of the standard CAN network for the interconnection between the sensor unit 3 and meter unit 2 is advantageous since it is robust against electromagnetic interference and allows implementation of a secure data communication.

The separation of the current sensor unit 2 from the meter unit 3 is particularly advantageous in that the meter unit can be positioned in a convenient location for access by operators and users while the sensor unit can be in a protected environment that may be less convenient to access. The meter unit's function includes connection to the charging station controller and processing and transmission of the measurement signal, whereas the sensor unit can be positioned along the charging DC cable in a position not too far from an electrical vehicle charging post in order to perform accurate measurement of the voltage and current close to the actual charging connector 28.

The sensor unit is adapted for coupling to a primary conductor 27a to measure the current flowing through the primary conductor. In the illustrated embodiment, the sensor unit comprises a current sensor 5 with primary conductor connection terminals 18 allowing ends of a primary conducting cable to be bolted, clamped, soldered or otherwise connected thereto. In the present embodiment, the current sensor is in the form of current measurement shunt, such shunt sensors being per se well-known in the art of current measurement, the details of which will therefore not be further explained.

In an embodiment, the sensor unit 3 comprises at least one temperature sensor, mounted in a way that temperature of the shunt can be directly or indirectly sensed. The measured temperature is used to compensate temperature drift of the measurements in the sensor unit 3. Indeed, operating temperature of the measurement electronic can be for example from −40° C. to +130° C.

When two temperature sensors are used, they are placed in a way that they can accurately sense the temperature on both side of the shunt. This symmetric temperature measurement allows to estimate the temperature of both sides of the shunt. Thanks to this estimation, thermal EMF produced by the two metallic junctions is mitigated. Computation of the thermal EMF may be done in the microprocessor.

The sensor unit comprises a housing having a base 14 and a cap 16, a microprocessor 7 mounted within the housing, a communication interface 8 mounted in the housing and presenting a connector 12, for instance a pluggable connector to the interconnection cable 25, and a voltage sensor 6 for measuring the voltage difference between the pair of DC power supply lines 27a, 27b.

The current measurement shunt measures the DC current flowing through one of the DC power supply lines 27a across connection ends 29a, 29b, the current measurement signal being fed into an analog front end and then to the microprocessor 7.

The current measurement analog front end integrates a amplifier, with a gain controlled by the microprocessor. This per se well-known technique allows to measure very low amplitude signals from the shunt.

The microprocessor may advantageously comprise an analog to digital convertor (ADC) 24a for converting the analog current measurement signal into a digital signal. The ADC may for instance advantageously be in the form of a known sigma delta convertor.

The sensor unit advantageously includes a tamper sensor that detects the integrity of the housing and any violation of opening of the housing in order to detect any tampering, in particular of the analog signal.

The sensor unit further comprises a voltage sensor 20 adapted for measuring the voltage between the pair of DC power supply lines 27a, 27b, the voltage measurement signal being fed into the microprocessor 7 and converted from an analog signal to a digital signal via an analog digital convertor 24b which may be of a similar or different type to the ADC of the current sensing measurement.

The voltage and current measurements may be used to compute a measurement of a power.

The power measurement signal and optionally the voltage and current measurement signals and other data that is fed through into the interconnection cable 25 to the meter unit 2 may advantageously be encrypted by an encryption module in the microprocessor 7 of the sensor unit. The data communication between the sensor unit and meter unit which is also provided with an encryption and decryption module is thus secure. Moreover, the meter unit 2 and sensor unit 3 are provided each with a unique identifier and are matched during an authentication process prior to first use, or from time to time during maintenance operations for instance, such that the sensor unit 3 and meter unit 2 can only be used together if they are authenticated and matched. This would also allow, depending on the application, a plurality of sensor units from different charging posts to be connected to a single meter unit as schematically illustrated for instance in FIG. 4.

Advantageously, the power measurement may be performed within the sensor unit and transmitted to the meter unit. This increases reliability and security and reduces the number of measurement signals to be transmitted between the sensor unit and meter unit. Nevertheless, the voltage and/or current measurement of the sensor unit 3 can be sent to the charging station controller 41 via the meter unit 2. The transmitted voltage and/or current measurement may be used to add redundancy to the control of the charging station's power converters 42.

In an advantageous embodiment, the voltage sensor 6 comprises voltage cables 22 that are connected to the DC power supply lines 27a, 27b at a connection point distal from the sensor unit, and in particular at a connection point 37 that is in EV connector or proximate the EV connector such that an accurate voltage measurement at the point of connection is measured. Preferably, the voltage cables are connected to the connection terminals in the EV connector to ensure that any resistance in the section of cable between the sensor unit and EV connector causing a voltage drop, does not affect the power measurement value. This arrangement also allows the sensor unit 3 to be positioned on the charging cable 27a at a certain distance from the connector 28, for instance 2 to 50 meters, such that the sensor unit may be positioned in a charging post in a secure housing whereas the cable 27a, 27b with the EV connector 28 may be provided with the certain length to allow connection to a vehicle at a certain distance from the charging post.

In a variant, the voltage measurement may be taken at the sensor unit 3, one taken from one of the connection ends 29a on a first power supply line 27a and the other by a cable or other conductor connected to the other DC power supply line 27b. In the latter variant, before first use and optionally from time to time for instance during maintenance intervals, the voltage drop between the EV connector 28 and the voltage cable connection point 37 may be measured and accounted for in a calibration function during the computation of the power measurement output signal.

The voltage sensor 6, as best illustrated in FIG. 6, may advantageously comprise a voltage input 43 where both inputs can be at a different potential with respect to the ground potential, whereby two series connected resistors in the upper branch of the illustrated dividers provides safety in the case one resistor is short circuited. The input 43 is connected to an amplifier circuit 44 which allows to have a single ended ADC input. In the illustrated circuit, the lower input is connected to ground such that the two illustrated "ADC" blocks form in practice a single ADC 24b. The input 43 is further connected to a comparator circuit 45 to detect the higher absolute value of the input voltages with respect to ground potential, and the output of the comparator circuit is fed into a logic circuitry 46 which determines which of two possible gains to use for the interpretation of the output value of the ADC: the two voltage dividers on the left can have a slightly different attenuation level because they are made of distinct components with certain tolerances. In typical use cases, only one of the voltages is high with respect to ground (hundreds of volts) whereas the other voltage is rather small (millivolts to volts). Therefore the overall measurement error can be minimized when different gains are used depending on the output of the comparator.

The housing 4 comprises a base 14 and a removable cap 16 that allows connection of the connection ends 29a, 29b of one of the DC power supply lines 27a to the sensor unit 3, and also for connection of the voltage sensor cables 22 to connection terminals in the sensor housing. The cap is configured to cover the terminals and may further comprise a locking post on the housing that passes through an orifice in the cap, the locking post provided with an orifice allowing a wire of a seal 38 to be passed therethrough to ensure that the cover may only be taken off if the seal is broken.

An integrity sensor (not shown) may also be provided to detect if the cover 16 is removed from the base 14, the integrity sensor data being stored in a memory 36 of the processor 7 and transmitted to the meter unit 2 to alert to a violation or opening of the sensor unit cover.

A sealing ring between the base and the cover around the outer periphery thereof may be provided to provide a water resistant seal between the housing and base. Electrical and electronic components within the housing are in a hermetically sealed environment that may in a variant be filled with an insulating potting material that is per se known in the art of current transducers.

Electrical power to the sensor unit 3 may be supplied from the meter unit 2. In a variant, power for the sensor unit may be harvested from the DC power supply lines 27a and 27b. Compensation for the harvested power would not need to be performed in view of the negligible amount compared to the amount of power used for charging a vehicle.

A further advantage of separating the sensor 3 unit and the meter unit 2 is the protection against the high voltages of the DC housing supply lines that may be an order of 1 to 2 kilovolts. This separation is done in the sensor unit 3, thus placing the communication cable 25 and the meter unit 2 in a safety extra low voltage area. Thus, meter unit 2 and communication cable 25 can safely be operated.

The computation of the power measurement signal from the digital measurement signals output by the ADCs of the voltage measurement sensor and current measurement sensor may be computed at a fairly low frequency, for instance in the order of 1 to 100 hertz, for instance typically around 10 Hz. A measurement in this range reduces computation requirements and memory yet allows accurate power measurement considering that the variations in current and voltage during a charging operation having fluctuations with a low frequency. A low frequency measurement sampling also reduces the amount of data transmitter between the sensor unit and meter unit. Nevertheless, sampling of the ADCs 24a 24b can be performed at high frequency, for instance around 500 kHz, which is a typical operating frequency of delta sigma ADCs.

A further advantage of separating the sensor unit 3 and the meter unit 2 is the possibility to connect several sensor units to a single meter unit 2. Electrical vehicle charging station may offer several independent DC power supply lines, to charge several independent electric vehicles.

A further advantage of separating the sensor unit 3 and the meter unit 2 is the possibility to mount the sensor unit 3 in a high side position or a low side position. This flexibility enhances the integration possibility in the charge post, where space in limited.

Depending on the high side or low side mounting of the sensor unit 3, the electrical configuration of the voltage measurement analog front end is not the same. The leg of the high impedance voltage divider in use depends directly on the mounting configuration. The gain of the two legs of the high impedance voltage resistive divider is not the same. The gain difference results in an inaccuracy of the voltage measurement. To compensate this effect and avoid using high precision resistors, intermediate circuitry senses which leg is in use, and indicates the result to the microprocessor. Consequently, the microprocessor uses two internal compensation registers to mitigate the gain error of the two different legs.

The intermediate circuit senses which of the two internal signals is the closest to the reference voltage. This indicates the high side or low side mounting to the microprocessor.

Figure 1:
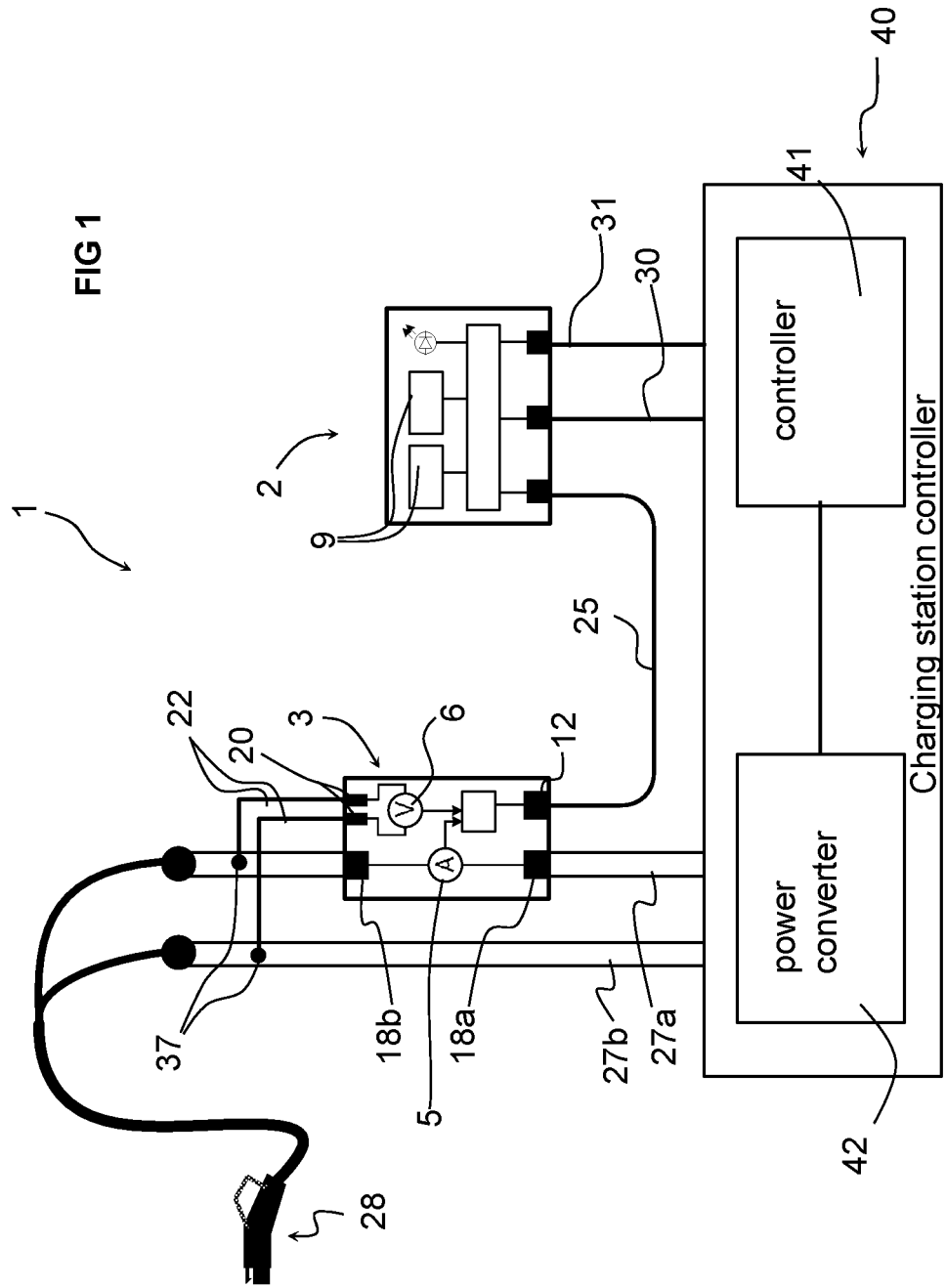
FIG. 1 is a schematic illustration of a DC meter according to an embodiment of the invention implemented in an electrical vehicle charging system.
Figure 2:
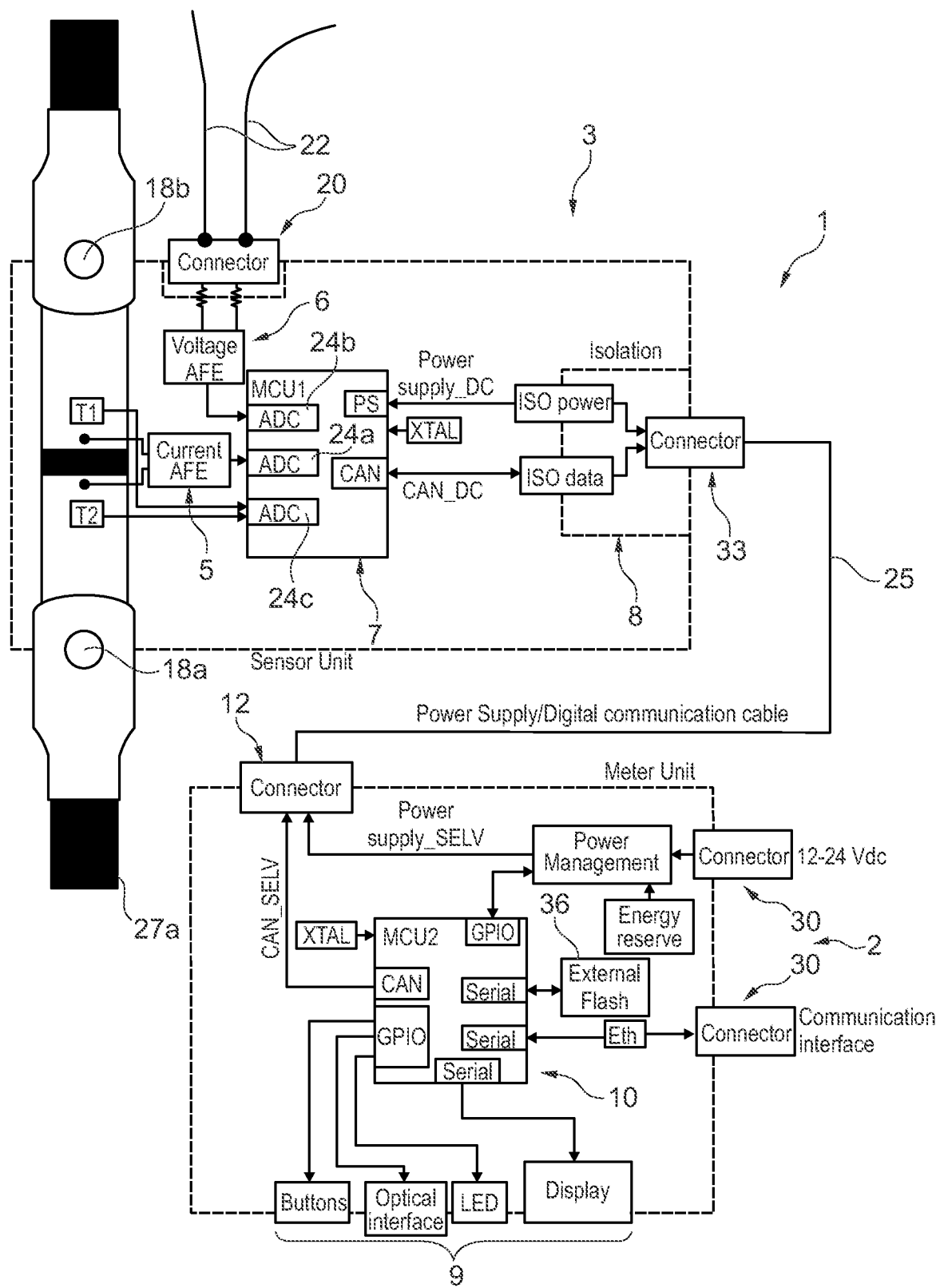
FIG. 2 is a schematic illustration of a DC meter according to an embodiment of the invention.

The voltage measurement analog front end may further comprise temperature sensors T1, T2 (as shown in FIG. 2) connected to an ADC 24c to reduce temperature drift of the measurement. Drift of the reference voltage may be compensated in the microprocessor by taking into account the measured temperatures from the temperature sensors.

LIST OF REFERENCES

DC meter 1
  Meter unit 2
    user interface 9
      LCD, buttons, status lights
    microprocessor 10
    sensor interface 11
      connector 12
        electrical
        optical
    metering interface (with charging station controller) 30
    power supply 31
    anti-tamper sensor 35
Sensor unit 3
  housing 4
    base 14
    cap 16
    anti-tamper seal 38
  current sensor 5
    primary conductor connection terminals 18a, 18b
  voltage sensor 6
    voltage connector 20
    voltage cables 22
    distal connection points 37
    Voltage input 43
    Amplifier circuit 44
    Comparator circuit 45
    logic circuit 46
  microprocessor 7
    ADC 24a, 24b, 24c
    memory 36
  communication interface 8
    data connector 33
Interconnection cable 25
DC power supply lines 27a, 27b
  connection end 29a, 29b
    EV connector 28
Charging station
  Charging station controller 40
    controller 41
    power converter 42

The invention claimed is:

1. A DC meter for an electrical vehicle charging station having a pair of DC power supply lines extending from a charging station controller to an electrical vehicle connector, the DC meter comprising a meter unit and a sensor unit, the meter unit comprising a user interface, a sensor interface for connection to the sensor unit, a metering interface for connection to the charging station controller, and a microprocessor configured to receive and process signals received from the sensor unit, to exchange data with the charging station controller and to receive commands from the user interface and output information to the user interface, wherein the sensor unit is separate from the meter unit and connected at a point distal from the meter unit via an interconnection cable for the transmission of measurement signals, the sensor unit comprising a current sensor coupled to one of the pair of DC power supply lines and configured for measuring the current flowing through said power line, the sensor unit further comprising a voltage sensor for coupling to each of the pair of power supply lines for measuring a voltage difference therebetween, the sensor unit further comprising a microprocessor with analog to digital convertors (ADC) for converting received analog voltage measurement and current measurement signals to digital signals, the sensor unit further comprising a communication interface configured for transmission of encrypted data through the interconnection cable to the meter unit, wherein the voltage sensor comprises a connector coupled to voltage sensor cables having connection ends distal from the sensor unit for connection to the DC power supply lines at or proximate the electrical vehicle connector, wherein the sensor unit comprises a connector for the voltage sensor cables and a connector for the communication interface for connection to the interconnection cable.

2. The DC meter according to claim 1, wherein the microprocessor of the sensor unit comprises a module for computation of the power consumed by a connected electrical vehicle using the voltage measurement and current measurement signals, a power measurement value computed by the microprocessor being transmitted to the meter unit.

3. The DC meter according to claim 2, wherein the power measurement computation is computed from a current measurement signal and/or voltage measurement signal sampled every 1 to 0.01 seconds.

4. The DC meter according to claim 2, wherein in addition to a power measurement signal transferred from the sensor unit to the meter unit, voltage and current measurement data are also transmitted.

5. The DC meter according to claim 1, wherein the sensor unit and meter unit comprise unique identification numbers stored in respective memories, the sensor unit and meter unit being able to communicate once they have been paired with their unique identification numbers.

6. The DC meter according to claim 1, wherein the sensor unit and meter unit comprise encryption modules for encrypted communication of data between the sensor unit and meter unit.

7. The DC meter according to claim 1, wherein the current sensor is a current measurement shunt and one of the DC power supply lines is split and comprises connection ends for connection to respective connection terminals of the sensor unit.

8. The DC meter according to claim 1, wherein the sensor unit comprises a housing having at least a base and a cap, primary conductor connection terminals being provided extending out of the base and covered by the cap, the cap being removably positionable over the terminals and connectors and comprising means for tamper proof securing to the base.

9. The DC meter according to claim 1, wherein the sensor unit communication interface transmits data to the meter unit via the interconnection cable at a voltage of less than 50 volts.

* * * * *